United States Patent
Hirano et al.

[11] Patent Number: 5,812,022
[45] Date of Patent: Sep. 22, 1998

[54] DIFFERENTIAL AMPLIFIER CIRCUIT HAVING LOW NOISE INPUT TRANSISTORS

[75] Inventors: Tetsuo Hirano, Anjo; Ryuichirou Abe, Nagoya; Hiroaki Tanaka, Okazaki, all of Japan

[73] Assignee: Nippondenso Co., Ltd., Kariya, Japan

[21] Appl. No.: 715,610

[22] Filed: Sep. 18, 1996

[30] Foreign Application Priority Data

Sep. 22, 1995 [JP] Japan .................................. 7-244175

[51] Int. Cl.⁶ ....................................................... H03F 3/45
[52] U.S. Cl. ............................ 327/563; 327/53; 327/66; 327/391; 330/253; 330/257
[58] Field of Search .................... 327/563, 562, 327/561, 66, 65, 63, 53, 52, 541, 543, 352, 389, 391; 330/253, 257

[56] References Cited

U.S. PATENT DOCUMENTS

| | | | |
|---|---|---|---|
| 4,346,344 | 8/1982 | Blauschild | 323/313 |
| 5,130,666 | 7/1992 | Nicollini | 330/253 |
| 5,357,149 | 10/1994 | Kimura . | |
| 5,440,272 | 8/1995 | Orisaka et al. | 330/253 |
| 5,600,275 | 2/1997 | Garavan | 327/63 |
| 5,621,374 | 4/1997 | Harkin | 330/253 |
| 5,635,880 | 6/1997 | Brown | 330/253 |

FOREIGN PATENT DOCUMENTS

| | | | |
|---|---|---|---|
| 58-115905 | 7/1983 | Japan | H03F 3/16 |
| 60-236190 | 11/1985 | Japan | G11C 11/34 |
| 1-232809 | 9/1989 | Japan | H03F 3/45 |
| 3-117106 | 5/1991 | Japan | H03F 3/45 |
| 4-029243 | 5/1992 | Japan | H03F 3/345 |
| 4-352358 | 12/1992 | Japan | H01L 27/095 |
| 4-360307 | 12/1992 | Japan | H03F 1/26 |
| 5-102837 | 4/1993 | Japan | H03K 19/0952 |
| 5-259761 | 10/1993 | Japan | H03F 3/45 |

*Primary Examiner*—Timothy P. Callahan
*Assistant Examiner*—Terry L. Englund
*Attorney, Agent, or Firm*—Cushman Darby & Cushman IP Group of Pillsbury Madison & Sutro LLP

[57] ABSTRACT

A differential amplifier circuit whose noise is reduced when used in a CMOS operational amplifier without increasing its cost includes a differential input stage circuit in which gate lengths of load transistors and gate lengths of differential input transistors are set to an optimal ratio to minimize internal transistor noise components.

18 Claims, 2 Drawing Sheets

DIFFERENTIAL AMPLIFIER CIRCUIT HAVING LOW NOISE INPUT TRANSISTORS

CROSS-REFERENCE TO RELATED APPLICATION

The present application is related to and claims priority from Japanese Patent Application No. Hei. 7-244175, incorporated herein by reference.

BACKGROUND OF THE INVENTION

1. Field of the Invention

The present invention relates to a differential amplifier circuit using MOS transistors and more particularly to a differential amplifier circuit suitable for a linear amplifier integrated circuit.

2. Description of Related Art

A CMOS operational amplifier using a differential amplifier circuit of this sort has had a problem in that because of internal noise caused by MOS transistors themselves, or 1/f noise, i.e., noise component inversely proportional to frequency (in a low frequency domain in particular) is so significant, it adversely affects the operational characteristics of the amplifier, though the amplifier has merits such that its power consumption is low and its input impedance is high as compared to a bipolar operational amplifier.

Accordingly, it is a requisite condition to reduce the internal noise of the MOS transistors under circumstances where a high signal-to-noise (S/N) ratio is required like when such a CMOS operational amplifier as described above is applied to a signal amplifier circuit for amplifying a small signal like a sensor output.

FIG. 4 shows a well-known circuit structure of the CMOS operational amplifier. In the figure, the CMOS operational amplifier includes, in combination, a differential amplifier circuit 11 which is a differential input stage circuit, a source ground amplifier circuit 12 which is an output stage circuit (gain stage circuit) and a constant current circuit 13.

In the differential amplifier circuit 11, load transistors M21 and M22 which constitute a current mirror circuit for supplying current to a differential transistor pair are formed by p-channel MOS transistors and differential input transistors M23 and M24 which constitute the differential pair as well as a constant current sink transistor M25 are formed by n-channel MOS transistors.

The source ground amplifier circuit 12 includes, in combination, an n-channel MOS transistor M26, a p-channel MOS transistor M27 and a phase compensating capacitor C, and the constant current circuit 13 includes, in combination, an n-channel MOS transistor M28 and a resistor R. The reference symbols Vin1 and Vin2 denote input terminals, Vout an output terminal and Vdd a supply voltage terminal, respectively.

Among noise components in the CMOS operational amplifier shown in FIG. 4, internal noise of the differential input transistors M23 and M24 and of the load transistors M21 and M22 which constitute the differential amplifier circuit 11 affect the amplifier's operation the most. Here, an input reduced noise voltage $VnT^2$ of the CMOS operational amplifier may be expressed as shown in Equation (1):

$$VnT^2 = Veq21^2 + Veq22^2 + \left(\frac{gm23}{gm21}\right)^2 (Veq23^2 + Veq24^2) \quad (1)$$

where $Veq21^2$ and $Veq22^2$ are internal noise component signals of the load transistors M21 and M22, $Veq23^2$ and $Veq24^2$ are internal noise component signals of the differential input transistors M23 and M24, and gm21 and gm23 are transfer conductances of the load transistor M21 and the differential input transistor M23, respectively. It is presumed that transfer conductances gm22 and gm24 of the other load transistor M22 and the differential input transistor M24 are related by the equalities gm22=gm21 and gm23=gm24.

The gate of each MOS transistor has a gate length and a gate width, as is well-known in the art. The gate length and gate width of a typical MOS transistor are illustrated in FIGS. 5A and 5B, where L1 shows the gate length of the gate of a MOS transistor having a semiconductor region 102 disposed on a substrate 101, and W1 shows the gate width of the transistor gate.

It has been known that when internal noise of a typical MOS transistor is expressed as $Veq^2$, the internal noise $Veq^2$ is inversely proportional to an area of the transistor gate (gate length×gate width) as expressed by Equation (2):

$$Veq^2 = \frac{K}{L \cdot W \cdot Cox \cdot f} \Delta f \quad (2)$$

where L is the gate length (channel length), W is the gate width (channel width), Cox is a gate capacitance, K is a flicker coefficient, and f is the frequency of a signal applied to the transistor.

As is known in the art, the flicker coefficient is a parameter dependent on semiconductor material and geometry which controls average 1/f noise according to Equation (3):

$$i_{avg}^2 = K \frac{I^a}{f^b} \Delta f \quad (3)$$

where $i_{avg}^2$ is the average noise current, I is a constant current applied to the semiconductor, a is a device-dependent coefficient between 0.5 and 2, and b is a device-dependent coefficient which is approximately 1.

Accordingly, the internal noise of the MOS transistors and the noise of the CMOS operational amplifier may be reduced by increasing the area of the gate of the MOS transistors.

However, such a measure has had a problem that the area of the gate has to be increased unnecessarily in order to reduce the 1/f noise of the MOS transistor, thus causing an increase in the cost of the amplifier and a reduction in the compactness thereof.

In the past, a CMOS operational amplifier arranged to reduce the whole noise level by suppressing the effect of the noise of the load transistors by increasing the transfer conductance of the differential input transistors by three times or more of that of the load transistors has been proposed as seen in Japanese Patent Publication Laid-Open No. Hei 4-360307. However, reducing a gate length of the differential input transistors to increase the transfer conductance of the differential input transistors more than that of the load transistors poses a new problem in that the channel is extremely shortened, thus undesirably increasing the noise of the CMOS operational amplifier.

SUMMARY OF THE INVENTION

Accordingly, it is an object of the present invention to solve the aforementioned problem by applying the principle that there is a unique ratio of the gate length of the differential input transistors to that of the load transistors which minimizes the noise of the CMOS operational amplifier and by using that ratio or a ratio in the vicinity thereof in determining respective gate lengths of the differential input transistors and load transistors.

In order to achieve the aforementioned object, a first aspect of the present invention provides a differential amplifier circuit in which differential input transistors composing a differential pair and load transistors composing a current mirror circuit for supplying current to the differential pair are formed by MOS transistors, wherein a ratio of a gate length of the load transistors to a gate length of the differential input transistors is set substantially at a square root of a ratio of a value of a flicker coefficient of the load transistors multiplied by a mobility thereof to a value of a flicker coefficient of the differential input transistors multiplied by a mobility thereof.

When the differential input transistors are formed by n-channel MOS transistors and the load transistors are formed by p-channel MOS transistors, the differential amplifier circuit is preferably constructed so that Equation (4) holds:

$$\frac{Li}{Lj} = \sqrt{\frac{Kn \cdot \mu n}{Kp \cdot \mu p}} \qquad (4)$$

where Li is the gate length of the differential input transistors, Kn and $\mu n$ are the flicker coefficient and mobility thereof, Lj is the gate length of the load transistors, and Kp and $\mu p$ are the flicker coefficient and mobility thereof.

When the differential input transistors are formed by p-channel MOS transistor and the load transistors are formed by n-channel MOS transistors, the differential amplifier circuit is preferably constructed so that Equation (5) holds:

$$\frac{Li}{Lj} = \sqrt{\frac{Kp \cdot \mu p}{Kn \cdot \mu n}} \qquad (5)$$

where Li is the gate length of the differential input transistors, Kp and $\mu p$ are the flicker coefficient and mobility thereof, Lj is the gate length of the load transistors, and Kn and $\mu n$ are the flicker coefficient and mobility thereof.

Preferably, the gate width of the load transistors is at least twice the gate width of the differential input transistors, i.e., Wj/Wi≧2, where Wj is the gate width of the load transistors and Wi is the gate width of the differential input transistors, to provide a useful fabrication topology.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

Figure 1:
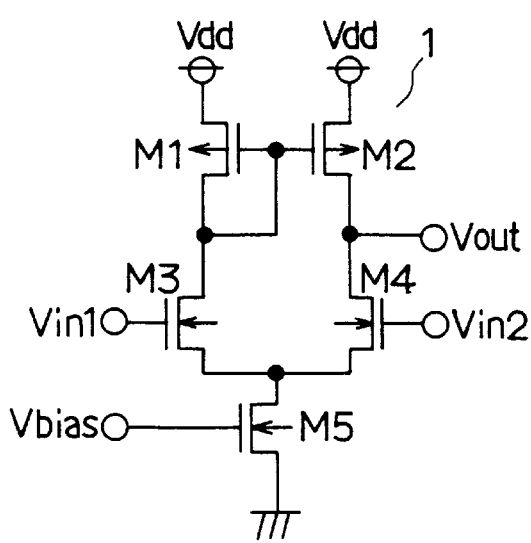
FIG. 1 is a schematic diagram showing a first preferred embodiment of the present invention.

FIG. 1 shows a first embodiment of the present invention. In FIG. 1, a differential amplifier circuit 1 which constitutes a differential input stage of a CMOS operational amplifier includes load transistors M1 and M2 which constitute a current mirror circuit for supplying current to a differential pair, differential input transistors M3 and M4 which constitute the differential pair and a constant current sink transistor M5.

In this case, the load transistors M1 and M2 are formed by p-channel MOS transistors and the differential input transistors M3 and M4 as well as the constant current sink transistor M5 are formed by n-channel MOS transistors.

It is noted that input terminals Vin1 and Vin2 are connected to gates of the differential input transistors M3 and M4, an output terminal Vout is connected to a drain of one differential input transistor M4, supply voltage terminals Vdd are connected to the load transistors M1 and M2, and a bias voltage input terminal Vbias is connected to a gate of the constant current sink transistor M5, respectively.

If gate widths W3 and W4 as well as gate lengths L3 and L4 of the differential input transistors M3 and M4 are respectively equal and if gate widths W1 and W2 as well as gate lengths L1 and L2 of the load transistors M1 and M2 are also respectively equal, respective transfer conductances gm1, gm2, gm3 and gm4 of transistors M1, M2, M3 and M4 may be expressed as shown in Equations (6) and (7):

$$gm1 = gm2 = \sqrt{2 \cdot \mu p \cdot Cox \cdot \frac{W1}{L1} \cdot Id} \qquad (6)$$

$$gm3 = gm4 = \sqrt{2 \cdot \mu n \cdot Cox \cdot \frac{W3}{L3} \cdot Id} \qquad (7)$$

where $\mu p$ is a mobility of the p-channel MOS transistors (load transistors M1 and M2), $\mu n$ is a mobility of the n-channel MOS transistors (differential input transistors M3 and M4), Cox is a gate capacitance of each transistor M1 through M4 and Id is a drain current of each transistor M1 through M4.

Then, an input reduced noise voltage $VnT^2$ of the CMOS operational amplifier may be obtained by Equation (8) obtained by substituting the above Equations (6) and (7) and the aforementioned Equation (2) into Equation (1) and by reducing the equation after the substitution:

$$\frac{VnT^2}{\Delta f} = \frac{2 \cdot Kn}{f \cdot W3 \cdot L3 \cdot Cox} \left( 1 + \frac{Kp \cdot \mu p \cdot L3^2}{Kn \cdot \mu n \cdot L1^2} \right) \qquad (8)$$

where Kp is a flicker coefficient of the p-channel MOS transistors (load transistors M1 and M2) and Kn is a flicker coefficient of the n-channel MOS transistors (differential input transistors M3 and M4).

If a ratio of the gate length L3 of the differential input transistor M3 to the gate length L1 of the load transistor M1 is expressed as in Equation (9) below, $$X = \frac{L3}{L1} \qquad (9)$$

the above Equation (8) may be expressed as Equation (10) below:

$$\frac{VnT^2}{\Delta f} = \frac{2 \cdot Kn}{f \cdot W3 \cdot L3 \cdot Cox} \left( \frac{1}{X} + \frac{Kp \cdot \mu p}{Kn \cdot \mu n} \cdot X \right) \qquad (10)$$

Differentiating Equation (10) with respect to X and finding X by setting the right side to zero gives the following Equation (11):

$$X = \frac{L3}{L1} \left( = \frac{L4}{L2} \right) = \sqrt{\frac{Kn \cdot \mu n}{Kp \cdot \mu p}} \quad (11)$$

Equation (11) represents a condition wherein the input reduced noise voltage $VnT^2$ of the operational amplifier including the differential amplifier circuit 1 containing the differential input transistors M3 and M4 and the load transistors M1 and M2 is minimized. Accordingly, the input reduced noise voltage $VnT^2$ of the operational amplifier may be minimized by setting the gate lengths L3 and L4 (L3=L4) of the differential input transistors M3 and M4 and the gate lengths L1 and L2 (L1=L2) of the load transistors M1 and M2 to satisfy the relationship of the above Equation (11).

Figure 2:
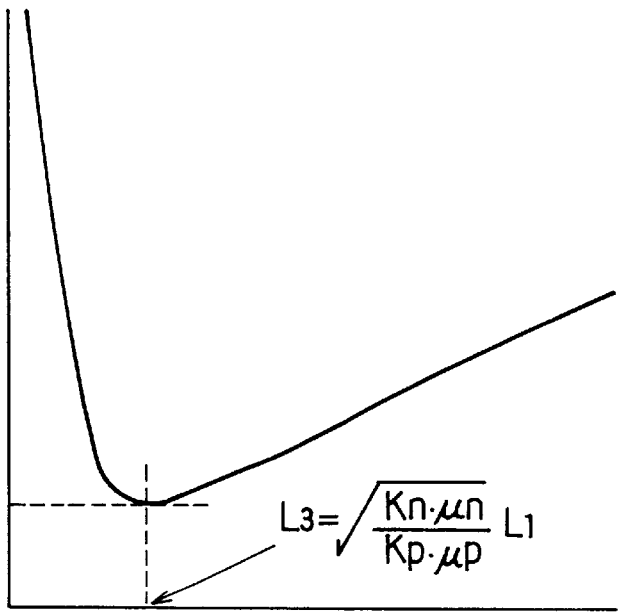
FIG. 2 is a graph showing a relationship between a gate length of a differential input transistor and an input reduced noise voltage of a CMOS operational amplifier according to the first embodiment.
Figure 4:
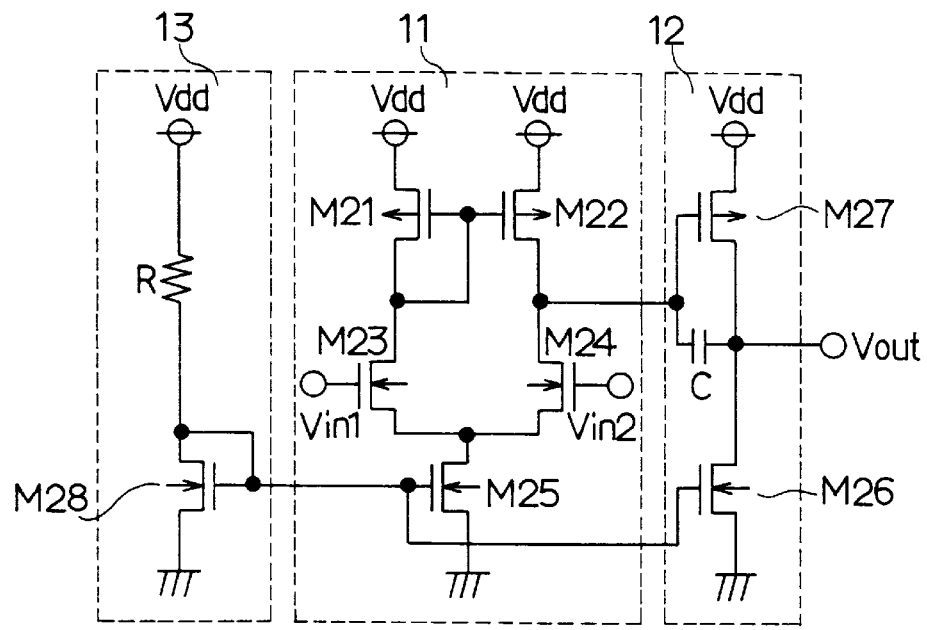
FIG. 4 is a schematic diagram showing a prior art differential amplifier circuit.
Figure 5A:
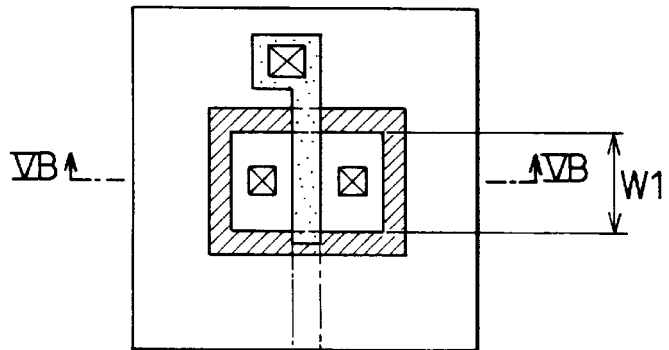
FIG. 5A is a plan view of a MOS transistor showing a gate width thereof.
Figure 5B:
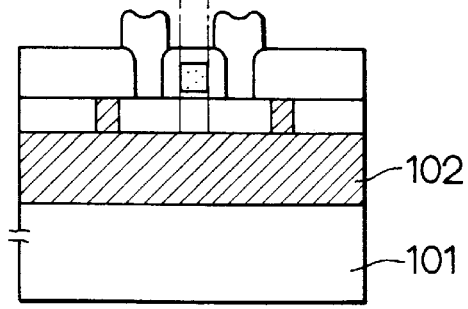
FIG. 5B is a cross-sectional view taken along line VB—VB in FIG. 5A showing a gate length thereof.

That is, when the gate lengths L1 and L2 (L1=L2) of the load transistors M1 and M2 are fixed, a relationship between the gate lengths L3 and L4 (L3=L4) of the differential input transistors M3 and M4 and the input reduced noise voltage $VnT^2$ of the CMOS operational amplifier turns out as shown in FIG. 2. As is apparent from FIG. 2, the input reduced noise voltage $VnT^2$ is minimized when the ratio of each gate length of the differential input transistors M3 and M4 and the load transistors M1 and M2 satisfies Equation (11).

In the differential amplifier circuit 1 of the present embodiment, the ratio of each gate length of the differential input transistors M3 and M4 and the load transistors M1 and M2 is set to substantially satisfy Equation (11) to reduce the noise of the CMOS operational amplifier using the differential amplifier circuit 1. Because the ratio of the gate length of each of the transistors M1 through M4 just needs to be changed to meet the above-mentioned condition at this time, the gate area of each transistor M1 through M4 need not be increased unnecessarily, unlike the prior art. As a result, the cost will not be increased and the trouble caused when the gate length of the differential input transistors M3 and M4 is reduced, i.e., the trouble that the noise of the CMOS operational amplifier is increased when the channel is shortened a great deal is eliminated, thus allowing a good noise characteristic to be obtained.

The term "substantially" as used herein and in the appended claims means a ratio close enough to the above-defined theoretical ratio to enable implementation of a circuit with a predetermined maximum S/N ratio.

Figure 3:
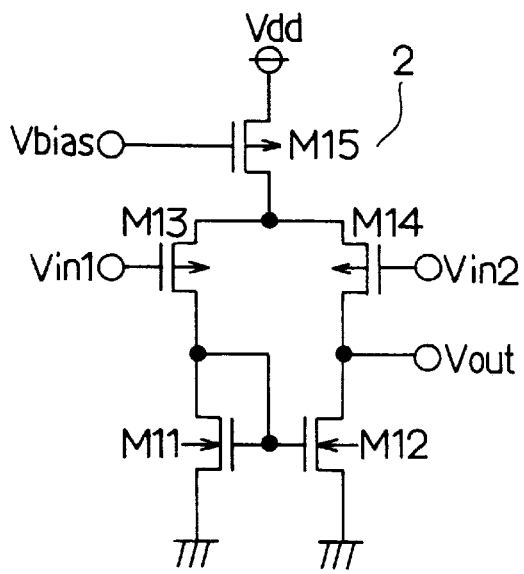
FIG. 3 is a schematic diagram showing a second preferred embodiment of the present invention.

FIG. 3 shows a second embodiment of the present invention. The second embodiment will be explained below concerning only parts thereof which differ from the first embodiment. That is, while the case in which n-channel MOS transistors are used for the differential input transistors has been described in the first embodiment, the second embodiment is characterized in that p-channel MOS transistors are used for the differential input transistors.

Preferably, the gate width of the load transistors is at least twice the gate width of the differential input transistors, i.e., Wj/Wi≧2, where Wj is the gate width of the load transistors and Wi is the gate width of the differential input transistors, to provide a useful fabrication topology.

In FIG. 3 showing a differential amplifier circuit 2 which constitutes a differential input stage of a CMOS operational amplifier, load transistors M11 and M12 which constitute a current mirror circuit for supplying current to a differential pair are formed by n-channel MOS transistors and differential input transistors M13 and M14 which constitute the differential pair and a constant current sink transistor M15 are formed by p-channel MOS transistors.

In the circuit constructed as described above, if gate widths W13 and W14 as well as gate lengths L13 and L14 of respective differential input transistors M13 and M14 are equal, respectively, and if gate widths W11 and W12 as well as gate lengths L11 and L12 of respective load transistors M11 and M12 are also equal, respectively, subscripts of each parameter of the p-channel MOS transistors and n-channel MOS transistors just need to be switched in Equations (1) through (11) and a noise minimizing condition which corresponds to Equation (11) may be obtained by the following Equation (12):

$$X = \frac{L13}{L11} \left( = \frac{L14}{L12} \right) = \sqrt{\frac{Kp \cdot \mu p}{Kn \cdot \mu n}} \quad (12)$$

Accordingly, the same effect as in the first embodiment may be obtained in the present embodiment by setting the ratio of each gate length of the differential input transistors M13 and M14 and the load transistors M11 and M12 which constitute the differential amplifier circuit 2 to substantially satisfy Equation (12).

As it is apparent from the above description, according to the present invention, the ratio of the gate length of the load transistors for supplying current to the differential pair to the gate length of the differential input transistors which constitute the differential pair is set substantially at a square root of a ratio of a value of the flicker coefficient of the load transistors multiplied by the mobility thereof to a value of the flicker coefficient of the differential input transistors multiplied by the mobility thereof so that the present invention brings about a beneficial effect that the noise of the circuit may be reduced without increasing its cost when the inventive differential amplifier circuit is used in a CMOS operational amplifier.

Although the present invention has been fully described in connection with the preferred embodiment thereof with reference to the accompanying drawings, it is to be noted that various changes and modifications will become apparent to those skilled in the art. For example, the invention is not limited to use with circuits in which physical dimensions, e.g., gate length and gate width, of the transistor pairs, i.e., the load transistor pair and the differential input transistor pair, are equal, and the derivation of appropriate relationships for other cases will be readily apparent to those skilled in the art. Such changes and modifications are to be understood as being included within the scope of the present invention as defined by the appended claims.

What is claimed is:

1. A differential amplifier circuit comprising:
    a differential input MOS transistor pair; and
    a current mirror circuit including MOS load transistors for supplying current to said differential transistor pair;
    wherein a ratio of a gate length of said load transistors to a gate length of said differential input transistors is set substantially at a square root of a ratio of a product of a flicker coefficient of said load transistors and a mobility thereof to a product of a flicker coefficient of said differential input transistors and a mobility thereof.

2. The differential amplifier circuit of claim 1, wherein a gate width of said load transistors is at least twice as large as a gate width of said differential input transistors.

3. The differential amplifier circuit of claim 1, wherein said differential input transistors are n-channel MOS transistors, said load transistors are p-channel MOS transistors, and said n-channel and p-channel MOS transistors satisfy the relationship $$\frac{Li}{Lj} = \sqrt{\frac{Kn \cdot \mu n}{Kp \cdot \mu p}}$$

where Li is the gate length of said differential input transistors, Kn and $\mu n$ are respectively a flicker coefficient and mobility thereof, Lj is the gate length of said load transistors, and Kp and µp are respectively a flicker coefficient and mobility thereof.

4. The differential amplifier circuit of claim 3, wherein a gate width of said load transistors is at least twice as large as a gate width of said differential input transistors.

5. The differential amplifier circuit of claim 1, wherein said differential input transistors are p-channel MOS transistors, said load transistors are n-channel MOS transistors, and said p-channel and n-channel MOS transistors satisfy the relationship $$\frac{Li}{Lj} = \sqrt{\frac{Kp \cdot \mu p}{Kn \cdot \mu n}}$$

where Li is the gate length of said differential input transistors, Kp and µp are respectively a flicker coefficient and mobility thereof, Lj is the gate length of said load transistors, and Kn and µn are respectively a flicker coefficient and mobility thereof.

6. The differential amplifier circuit of claim 5, wherein a gate width of said load transistors is at least twice as large as a gate width of said differential input transistors.

7. A differential amplifier circuit comprising:

a differential input MOS transistor pair; and a current mirror circuit including MOS load transistors for supplying current to said differential transistor pair;

wherein a ratio of a gate length of said load transistors to a gate length of said differential input transistors is determined substantially based on a ratio of a product of a flicker coefficient of said load transistors and a mobility thereof to a product of a flicker coefficient of said input transistors and a mobility thereof.

8. The differential amplifier circuit of claim 7, wherein a gate width of said load transistors is at least twice as large as a gate width of said differential input transistors.

9. The differential amplifier circuit of claim 7, wherein said differential input transistors are n-channel MOS transistors, said load transistors are p-channel MOS transistors, and said n-channel and p-channel MOS transistors satisfy the relationship $$\frac{Li}{Lj} = \sqrt{\frac{Kn \cdot \mu n}{Kp \cdot \mu p}}$$

where Li is the gate length of said differential input transistors, Kn and µn are respectively a flicker coefficient and mobility thereof, Lj is the gate length of said load transistors, and Kp and µp are respectively a flicker coefficient and mobility thereof.

10. The differential amplifier circuit of claim 9, wherein a gate width of said load transistors is at least twice as large as a gate width of said differential input transistors.

11. The differential amplifier circuit of claim 7, wherein said differential input transistors are p-channel MOS transistors, said load transistors are n-channel MOS transistors, and said p-channel and n-channel MOS transistors satisfy the relationship $$\frac{Li}{Lj} = \sqrt{\frac{Kp \cdot \mu p}{Kn \cdot \mu n}}$$

where Li is the gate length of said differential input transistors, Kp and µp are respectively a flicker coefficient and mobility thereof, Lj is the gate length of said load transistors, and Kn and µn are respectively a flicker coefficient and mobility thereof.

12. The differential amplifier circuit of claim 11, wherein a gate width of said load transistors is at least twice as large as a gate width of said differential input transistors.

13. A differential amplifier circuit comprising:

a differential input MOS transistor pair; and a current mirror circuit including MOS load transistors for supplying current to said differential transistor pair;

wherein a ratio of a gate length of said load transistors to a gate length of said differential input transistors is determined substantially based on a square root of a ratio of a product of a flicker coefficient of said load transistors and a mobility thereof to a product of a flicker coefficient of said input transistors and a mobility thereof.

14. The differential amplifier circuit of claim 13, wherein a gate width of said load transistors is at least twice as large as a gate width of said differential input transistors.

15. The differential amplifier circuit of claim 13, wherein said differential input transistors are n-channel MOS transistors, said load transistors are p-channel MOS transistors, and said n-channel and p-channel MOS transistors satisfy the relationship $$\frac{Li}{Lj} = \sqrt{\frac{Kn \cdot \mu n}{Kp \cdot \mu p}}$$

where Li is the gate length of said differential input transistors, Kn and µn are respectively a flicker coefficient and mobility thereof, Lj is the gate length of said load transistors, and Kp and µp are respectively a flicker coefficient and mobility thereof.

16. The differential amplifier circuit of claim 15, wherein a gate width of said load transistors is at least twice as large as a gate width of said differential input transistors.

17. The differential amplifier circuit of claim 13, wherein said differential input transistors are p-channel MOS transistors, said load transistors are n-channel MOS transistors, and said p-channel and n-channel MOS transistors satisfy the relationship $$\frac{Li}{Lj} = \sqrt{\frac{Kp \cdot \mu p}{Kn \cdot \mu n}}$$

where Li is the gate length of said differential input transistors, Kp and µp are respectively a flicker coefficient and mobility thereof, Lj is the gate length of said load transistors, and Kn and µn are respectively a flicker coefficient and mobility thereof.

18. The differential amplifier circuit of claim 17, wherein a gate width of said load transistors is at least twice as large as a gate width of said differential input transistors.

* * * * *